United States Patent [19]

Hawkes

[11] Patent Number: 4,994,767
[45] Date of Patent: Feb. 19, 1991

[54] OSCILLATOR PHASE-NOISE REDUCTION

[75] Inventor: Henry W. Hawkes, Winchcombe, England

[73] Assignee: The Secretary of State for Defence in Her Britannic Majesty's Government of the United Kingdom of Great Britain and Northern Ireland, London, England

[21] Appl. No.: 460,885
[22] PCT Filed: Jul. 1, 1988
[86] PCT No.: PCT/GB88/00517
  § 371 Date: Feb. 15, 1990
  § 102(e) Date: Feb. 15, 1990
[87] PCT Pub. No.: WO89/00788
  PCT Pub. Date: Jan. 26, 1989

[30] Foreign Application Priority Data

Jul. 13, 1987 [GB] United Kingdom ............... 8716458

[51] Int. Cl.$^5$ .......................... H03C 3/00; H03C 3/09
[52] U.S. Cl. ........................................ 332/123; 455/63
[58] Field of Search ...................... 332/117, 119, 123; 375/60; 455/63

[56] References Cited

U.S. PATENT DOCUMENTS

| 3,137,816 | 6/1964 | McLin et al. | 455/113 |
| 3,546,703 | 12/1970 | Kurth | 455/75 |
| 4,543,542 | 9/1985 | Owen | 332/18 |
| 4,755,774 | 7/1988 | Heck | 332/123 |

FOREIGN PATENT DOCUMENTS 0125811 11/1984 European Pat. Off. .

Primary Examiner—David Mis
Attorney, Agent, or Firm—Nixon & Vanderhye

[57] ABSTRACT

An output having reduced additives phase-noise in at least one defined frequency band is obained from a voltage-controlled oscillator (5) by applying a frequency-modulating signal $\omega_m t$ to the oscillator to produce a sideband within the defined band, the signal having a frequency much higher than the highest multiplicative phase-noise frequency (referred to the unmodulated oscillator frequency) in that band and producing a modulaton index $\Delta P$ much greater than the modulation index $\Delta P_n$ of the total phase-noise (i.e. additive plus multiplicative)in that band. The oscillator output is then phase-modulated with a signal at $\omega_m t$ selected from the output of a phase-shift frequency-discriminator (9) having an appropriate delay (d) which receives the oscillator (5) output either after the phase-modulation thereof by modulator (8), or before the phase-modulation thereof by modulator (20), or both, in a sense and at an amplitude which tends to cancel the additive phase-noise modulation in the oscillator output. In a preferred form the discriminator (9) receives the oscillator (5) output before its phase-modulation by modulator (20), and a frequency-modulatiing pilot-tone $(\omega_m + \omega_q)t$ of modulation index $\Delta P_q$ is also applied to the oscillator, where $\Delta P > \Delta P_q > P_n$. A feedback loop (29-34) detects variations in the phase and amplitude of the pilot-tone content of the final output and, via multiplier (27), controls the modulating input to modulator (20) in a sense to minimize the pilot-tone content and hence also the additive phase-noise.

25 Claims, 6 Drawing Sheets

OSCILLATOR PHASE-NOISE REDUCTION

BACKGROUND OF THE INVENTION

1. Field of the Invention

This invention relates to methods and apparatus for reducing the phase-noise in the output from an oscillator, in particular the additive phase-noise. It has one application in frequency-modulated (FM) oscillators and can also provide a non-modulated (CW) output having reduced additive phase-noise.

2. Discussion of Prior Art

Phase-noise can be classified into two main sources. The first is "additive" noise, in which the thermal noise of the oscillator, within the latter's spectral band, is added to its spectrum after amplification in accordance with the loop transfer function of the oscillator. This noise is subsequently converted indirectly to phase-modulation sidebands of the instantaneous oscillator frequency by the removal of amplitude-modulation (AM) components as a result of amplitude-limiting processes within the oscillator. This noise is thermal over the entire band, and is thus uncorrelated with itself over this band (except for a component produced by the above limiting processes, which is unaffected by the present invention).

The second source of phase-noise is "multiplicative" noise, which involves low-frequency noise (typically flicker noise) well outside the spectral band of the loop transfer function but generated within the oscillator. This low-frequency noise is converted upwards to lie within the loop band, as a result of non-linearities within the oscillator. Since, in effect, this noise modulates the oscillator, it produced sidebands corresponding to direct frequency/phase modulation of the oscillator. If the oscillator is itself deliberately modulated, e.g. by VCO (voltage-controlled oscillator) action, these noise sidebands are produced about each deliberately produced modulation sideband. These separate noise sidebands are thus correlated with each other unlike the sidebands from any separate additive noise which, as described above, are uncorrelated over the entire band.

In the case of FM oscillators, the very mechanism of frequency modulation which produces the sidebands tends to degrade frequency stabilities and thus to introduce spurious phase and amplitude noise arising from both additive and multiplicative sources. As will be shown, existing methods of reducing such phase-noise have a limited effect, and it is an object of the present invention to produce a further reduction. This reduction is effected in the additive phase-noise only, not in the multiplicative phase-noise (nor, as stated, in the unaffected additive component mentioned earlier, which effectively becomes multiplicative phase-noise).

SUMMARY OF THE INVENTION

The present invention does not operate over the whole frequency band of the oscillator, but only over a region surrounding each sideband. However, this is sufficient where the information and noise bandwidth is small compared with the modulation frequency, as is usually the case. Two further limitations are that the invention affects only frequency modulation by a sinusoidal waveform (or waveforms) and improves only relatively short-term additive phase-noise. Long-term frequency-stabilization can be provided in addition, using known arrangements for this purpose. For the purpose of the Application, phase-noise is, in effect, a short-term form of frequency instability, as will be shown.

According to the present invention a method of reducing the additive phase-noise in the output from an oscillator at a given frequency, in at least one defined frequency band, comprises:

applying a frequency-modulating signal to the oscillator to produce a frequency-modulation sideband of said given frequency within said band, said signal having a frequency much higher than the highest multiplicative phase-noise frequency (referred to the unmodulated oscillator frequency) in that band and producing a modulation index much greater than the modulation index of the total phase-noise (i.e. additive plus multiplicative) in than band;

and phase-modulating the output from said oscillator with a signal at the modulating frequency selected from the output of a frequency-discriminator having an appropriate delay which receives an amplitude-limited version of the oscillator output either before or after said phase-modulating thereof, in a sense and at an amplitude which tends to cancel the additive phase-noise modulation in the oscillator output;

whereby the thus phase-modulated output from the oscillator is a frequency-modulated output having reduced additive phase-noise in said band.

Said modulated-limited version of the oscillator output may be produced solely by amplitude-limiting the immediate output of the oscillator. Alternatively, said version may be produced by amplitude-limiting the immediate output of the oscillator other than sidebands close-in to its instantaneous frequency and, in addition, amplitude-limiting the immediate input to said frequency-discriminator.

The discriminator may receive the oscillator output after said phase-modulating thereof, said selected signal being fed back to effect said phase-modulating after relatively high amplification thereof.

Alternatively or additionally the discriminator may receive the oscillator output before said phase-modulating thereof, said selected signal being fed forward to effect said phase-modulating after relatively low amplification thereof.

The selected signal may be multiplied by an appropriately phase-shifted version of the frequency-modulating signal, the components of the product at the additive phase-noise frequencies only being selected and multiplied by the non-phase-shifted frequency-modulating signal, and the product of said second-mentioned multiplication being applied to effect said phase-modulating. Alternatively the selected signal may be appropriately phase-shifted and only the resulting components modulated at the additive phase-noise frequencies applied directly to effect said phase-modulating.

A frequency-modulating pilot-signal, preferably outside said defined frequency band, may additionally be applied to the oscillator to produce a modulation index greater than that of the total phase-noise but less than that of the first-mentioned frequency-modulating signal, the pilot-signal content of the additive phase-noise-reduced frequency-modulated oscillator output being detected and fed back to control the signal which effects said phase-modulating in a sense to reduce said pilot-signal content and hence the additive phase-noise content in said defined frequency band.

The additive phase-noise-reduced frequency-modulated output may be subsequently phase-modulated with said frequency-modulating signal applied in anti-phase whereby to obtain an output consisting substantially of said given frequency with reduced additive noise in said band.

The additive phase-noise-reduced frequency-modulated output may be subsequently filtered to remove said given frequency and all but one of said frequency-modulation sidebands to leave substantially only said one frequency-modulation sideband with reduced additive phase-noise therein. Said one frequency-modulation sideband may be applied as said frequency-modulating signal to frequency-modulate a subsequent oscillator whose output is subjected to a method of additive phase-noise reduction by a method as aforesaid.

The oscillator, or each oscillator, may be a voltage-controlled oscillator.

The invention also provides apparatus for use in a method as aforesaid.

BRIEF DESCRIPTION OF THE DRAWINGS

The invention will now be described, by way of example, with reference to the accompanying drawings wherein.

DETAILED DESCRIPTION OF PREFERRED EMBODIMENTS

Figure 1:
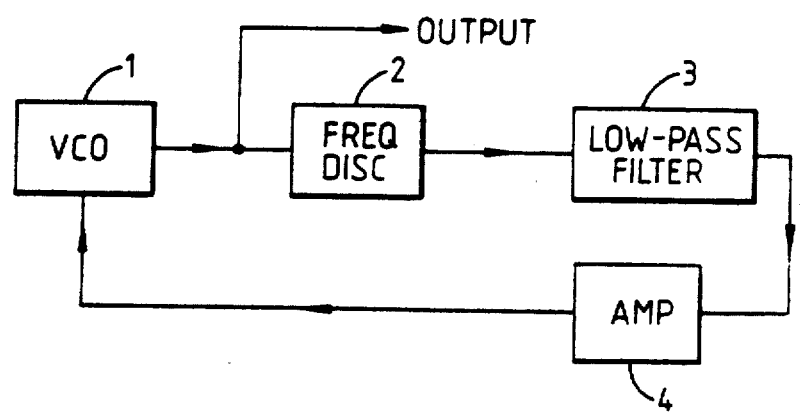
FIG. 1 is a schematic diagram of a known circuit for stabilising the frequency of an oscillator.

FIG. 1 shows a voltage-controlled oscillator (VCO) 1 whose output is frequency-stabilized in a known manner. The output is fed to a conventional phase-shift frequency discriminator 2 e.g. as described by Terman in "Electronic and Radio Engineering ", 4th Ed (1955), p 606, whose output is fed back to control the VCO via a low-pass filter 3 and an amplifier 4. The effect, even if an FM modulation is applied to the VCO, is to stabilize its centre frequency at that defined by the centre-frequency point (zero volts) of the distributor. Such an arrangement, albeit in slightly different forms, is used in TV receivers to stabilize the local oscillator whose output is mixed with the received RF signal to produce an intermediate frequency (IF) signal. The objective is to keep the TV waveform within the centre of the receiver pass-band in order to obtain adequate picture representation. Oscillator instabilities (i.e. phase-noise) giving rise to noise modulation of the sidebands are of no importance since they are relatively small. Such instabilities, however, can be significant in some systems which use a sub-carrier structure, formed by the sidebands produced by the frequency modulation, to carry further information sidebands.

Before describing the present invention, the characteristics of oscillator noise will be summarized. In an oscillator which is frequency-modulated by a sinusoidal waveform, the oscillator noise, whether from additive or multiplicative sources, can be resolved into two components as follows:

(a) Noise sidebands which are in mean phase with the rotating vector formed by the carrier as it is frequency/phase modulated by the sinusoidal (in the present context frequency modulation and phase modulation are synonymous). These sidebands cause amplitude modulation of the FM waveform and are removable by amplitude-limiting followed by filtering.

(b) Noise sidebands which are in mean quadrature with the rotating vector of (a). These sidebands in effect amplitude-modulate the modulation index (i.e. the carrier frequency deviation in one direction divided by the modulating frequency) and thus add their extra phase modulation to that of the sinusoidal. It is known that this phase-noise, in dBc/Hz (phase-noise referred to carrier) decreases as the offset from the nominal carrier, i.e. the oscillator frequency, increases, and it is this phase-noise which the present invention is concerned to reduce.

The following notation will be used in the subsequent description of the invention:

$\omega_o$ = RF carrier angular frequency, e.g. 200 MHz $\omega_{o(x)}$ = angular frequency (low) of multiplicative noise which, via inherent oscillator non-linearities, produces sidebands $\omega_o \pm \omega_{o(x)}$ $\omega_m$ = signal modulation angular frequency, e.g. 200 kHz $\omega_m + \omega_q$ = pilot-tone angular frequency, e.g. 250 kHz $\omega_n$ = general noise angular frequency, defined in specific cases $\omega_{n(+)}$ = angular frequency (high) of additive noise $O_{\omega n(+)}$ = notation for $\omega_{n(+)}$ when latter is within a narrow band, e.g. 100 kHz either side, of $\omega_o$ k = amplitude coefficient of additive noise t = time d = time-delay of discriminator $\phi = (\pi/2) - (\omega_m d/2)$ $\Delta P$ = modulation index of signal, e.g. 20 radians $\Delta P_q$ = modulation index of pilot-tone, e.g. 0.1 radian $\Delta P_{o(x)}$ = time-variant multiplicative phase-noise modulation $\Delta P_{o(x)}$ = modulation index of $\Delta P_{o(x)}$ $\delta P_m$ = time-variant additive phase-noise modulation within a narrow band, e.g. 10 kHz either side the mean value, of $\omega_m$ $\delta P_m$ = modulation index of $\delta P_m$ $\delta P_o$ = time-variant additive phase-noise modulation component of additive phase-noise sidebands near $\omega_o$ as resolved in mean quadrature with $\omega_o$ $\Delta P_n$ = general time-variant phase-noise modulation, defined in specific cases $\Delta P_n$ = modulation index of $\Delta P_n$ $J_0, J_1, J_2$ etc = Bessel Functions of appropriate arguments The frequency-modulated waveform is modified by both the additive and multiplicative noise sources and can be written as:

$$A = \cos(\omega_o t + \Delta P \cos \omega_m t + \Delta P_{o(x)} \cos \omega_{o(x)} t) + k \cos \omega_{n(+)} t \quad (1)$$

For a CW oscillator $\Delta P = 0$ and equation (1) can be written as:

$$A = \cos(\omega_o t + \Delta P_n \cos \omega_n t) \quad (2)$$

where the general notations $\Delta P_n$ and $\omega_n$ are used, for convenience, to represent both additive and multiplicative components. The additive mean quadrature term $\delta P_o$ contained in $k \cos \omega_{n(+)} t$ can be moved inside the cos ( ) term since $\Delta P \cos \omega_m$ has been removed, as explained later in more detail.

If multiplicative noise is absent or very small, equation (2) becomes:

$$A = \cos(\omega_o t + \delta P_o) \quad (2A)$$

Equations (2) and (2A) may have additive noise outside the close-to-carrier multiplicative spectrum, but in practice this is not significant since it can normally be removed by filtering.

Although equation (2A) appears to be that for a frequency-modulated oscillator, this is not so as it merely represents the quadrature mean phase sidebands with respect to the carrier $\omega_o$. A true noise-frequency-modulated oscillator would have an equation of the form:

$$A = \cos(\omega_o t + \Delta P_{o(x)} \cos \omega_{o(x)} t) \quad (2B)$$

The difference between (2A) representing the additive situation, and (2B) representing the multiplicative situation, is not completely covered by the above formal mathematics, but will become clearer when describing the situation where $\Delta P$ is larger rather than zero. If $\Delta P$ is large, higher frequencies of additive noise cannot be removed by the filtering mentioned above, because the $\Delta P$ modulation now produces a series of wanted spectral lines which occupy the aforesaid spectrum. In particular, the first sidebands of $\omega_o \pm \omega_m$ are likely to be contaminated by considerable $\omega_{n(+)}$ noise components. These components can be resolved approximately into a low-frequency amplitude modulation of $\Delta P$ (viz $\Delta P + \delta P_m$), which likewise appears around the other sidebands $\omega_o \pm 2\omega_m$, $\omega_o \pm 3\omega_m$, etc. Usually only the noise around the carrier and first sidebands are significant, and thus equation (1) can be rewritten as:

$$A = \cos[\omega_o t + (\Delta P + \delta P_m) \cos \omega_m t + \Delta P_{o(x)} \cos \omega_{o(x)} t] + \delta P_o \quad (3)$$

$\delta P_o$ cannot easily be moved inside the cos [ ] term because the resultant expression becomes too complex to have a reasonably simple physical interpretation. Any such movement would have to indicate that the low frequencies of $\delta P_o$ do not modulate each sideband of the FM signal but only produce sidebands in mean quadrature with the carrier. When multiplicative noise is present, this modulates directly both carrier and sidebands and can conveniently be placed within the cos [ ] term in order to indicate this fact. When $\Delta P$ falls to zero there are no sidebands of $\omega_m$ so that, via indirect carrier modulation, $\delta P_o$ can also be placed within the cos [ ] term; hence equations (2) and (2A).

The present invention is concerned with reduction of the additive noise $\delta P_m$ in the $\omega_o \pm \omega_m$ region in an absolute sense. In particular, it is an object of the present invention to provide, on order of importance:

(i) a CW oscillator in which additive noise around the output frequency is reduced, desirably to a level comparable with that of the multiplicative noise;

(ii) an FM oscillator with given values of $\omega_m$ in which the additive noise around the first and, optionally, higher-order sidebands, is reduced, desirably to a level comparable with that of the multiplicative noise.

Figure 7:
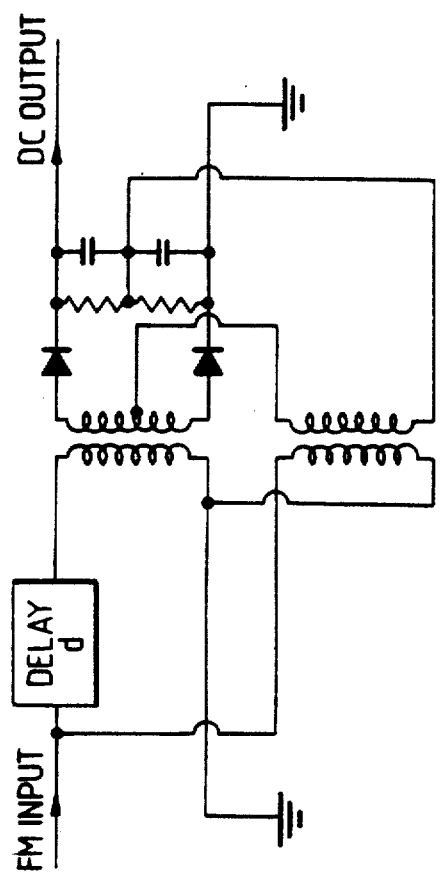
FIG. 7 is a circuit diagram of a phase-shift frequency discriminator suitable for use in the circuits of FIGS. 2 to 5.

In order to understand properly the operation of the present invention, it is necessary to appreciate the principles of frequency discrimination, particularly as effected by a conventional time-delay (i.e. phase-shift) discriminator. (For clarity, FIG. 7, which uses the usual component symbols and is self-explanatory, shows a known discriminator circuit which differs slightly from the Terman circuit mentioned earlier in that the delay d is defined by a separate integer, e.g. a lumped delay line, instead of being inherent in the tuned circuits shown by Terman. However, a Terman-type circuit can be used in the present invention.)

In this case, the input to discriminator 2 in FIG. 1 can be expressed by equation (2) above.

Alternatively, this can be expressed as a frequency-modulated signal, viz $$A = \cos(\omega_o t + \Delta P_n \omega_n \sin \omega_n t)$$

The time-delayed version of (2) produced in discriminator 2 is thus $$A(d) = \cos(\omega_o t + d + \Delta P_n \cos \omega_n t + d) \quad (4)$$

After cross-multiplication of (2)×(4) in the discriminator and removal of $2\omega_n$ components by filter 3, the output becomes $$B(d) = \cos\left(\omega_o d - 2\Delta P_n \sin\frac{\omega_n d}{2} \sin\left(\omega_n t + \frac{\omega_n d}{2}\right)\right)$$

$$\approx \cos\left(\omega_o d - \Delta P_n \omega_n d \sin\left(\omega_n t + \frac{\omega_n d}{2}\right)\right)$$

when $\frac{\omega_n d}{2}$ is less than 1 radian, or $$B(d) = \cos \omega_o d \left(\Delta P_n \omega_n d \sin\left(\omega_n t + \frac{\omega_n d}{2}\right)\right) \quad (5)$$

$$+ \sin \omega_o d \sin 48 \left(\Delta P_n \omega_n d \sin\left(\omega_n t + \frac{\omega_n d}{2}\right)\right)$$

$$= \cos \omega_o d [J_o(\Delta P_n \omega_n d) + 2J_2(\Delta P_n \omega_n d) \quad (6)$$

$$\cos(2\omega_n t + \omega_n d) + \ldots]$$

$$+ \sin \omega_o d \left[2J_1(\Delta P_n \omega_n d)\sin\left(\omega_n t + \frac{\omega_n d}{2}\right)\right.$$

$$\left.+ 2J_3(\Delta P_n \omega_n d)\sin\left(3\omega_n t + \frac{3\omega_n d}{2}\right)\right]$$

In equation (6) there is a series, multiplied by the factor $\sin \omega_o d$, whose first term is at the frequency $\omega_n$ and represents the main FM output of the discriminator; its amplitude is defined by the first-order Bessel component, $J_1$. This signal can be extracted by a low-pass filter (not shown) connected to the discriminator output (assuming momentarily the absence of the feedback loop comprising components 3 and 4) by selecting d to make $\sin \omega_o d$ equal to unity. In this case $\cos \omega_o d$ will be zero and hence no DC (represented by the $J_0$ term) or even harmonics (represented by the $2\omega_n t$ etc terms) will be present.

On the other hand, if central frequency stabilization of $\omega_o$ and not FM detection is required, it is advantageous to extract the zero-order Bessel component. This can also be achieved by making $\cos \omega_o d$ equal to zero at the required central frequency. Stabilization is then effected by including the feedback loop shown in FIG. 1, where the DC ($J_0$ term) is fed back to the VCO so that the DC voltage is near zero after transient conditions have disappeared. With such stabilization, the VCO will remain at the frequency defined by this near-zero output; i.e. as $\omega_o$ changes to $\omega_o + \delta\omega$, $\cos[(\omega_o + \delta\omega_o)d]$ becomes $$\cos(\omega_o d)\cos \delta\omega_o d - \sin(\omega_o d)\sin \delta\omega_o d =$$
$$-\sin(\omega_o d)\sin(\delta\omega_o d) \simeq -\delta\omega_o d$$

Thus the DC output changes sign as $\delta\omega_o$ drifts either side of the nominal carrier frequency $\omega_o$. Such an arrangement is valuable in normal broadcast reception, where the VCO is the local oscillator and is connected to the discriminator via a mixer, as it enables the final IF to be kept within the pre-detection bandwidths. In this case the filter 3 is given a very low cut-off in order to remove any FM signal information of the intentional or unintentional kind, e.g. noise.

If, however, phase-noise reduction is required, optimisation of the first-order Bessel component ($J_1$ term) is needed and the filter 3 is designed to pass both the $J_0$ and $J_1$ terms and not reject the fundamental $\omega_n$ signal $J_1$. This signal is fed back via amplifier 4 in such a way as to reduce the original frequency/phase modulation. In principle it is seen that increasing the bandwidth of filter 3 merely extends the frequency stabilization from the long term to the rapid (phase-noise) shorter term.

The following problems are associated with the foregoing conventional feedback techniques:

(i) The $J_1$ amplitude term in equation (6) approximates to $\Delta P_n \omega_n d$ and is a phase-detected term which represents the frequency modulation of the signal by the noise, since both this amplitude and the time-variant part, i.e.

$$\sin\left(\omega_n t + \frac{\omega_n d}{2}\right),$$

represent the noise component in equation (3). This term can be fed back to the oscillator for overall correction, but in practice such an oscillator must be a VCO as shown, which is itself more prone to phase-noise generation than e.g. a crystal oscillator would be.

(ii) The discriminator output is very small, as shown by the expansion of the $J_1$ amplitude term, i.e.:

$$2J_1 (\Delta P_n \omega_n d) \sin\left(\omega_n t + \frac{\omega_n d}{2}\right) \quad (7)$$
$$\simeq \Delta P_n \omega_n d \sin\left(\omega_n t + \frac{\omega_n d}{2}\right)$$

d must be small for practical reasons, since large time-delays at high frequencies (around $\omega_o$) are bulky and expensive; also because $\omega_n d$ must be kept small in order that (7) should approximate to a $\sin \omega_n t$ term which represents the feedback frequency-modulation term. In practice, usable values of d tend, via the factor $\omega_n d$, to reduce equation (7) amplitudes by about 80 dB (dependent on the value of $\omega_n$) and so represent a discriminator output loss which can soon reduce the detected output to below the level of the thermal noise generated in amplifier 4.

The nett effect is to limit the attainable phase-noise reduction. Typical figures are −85 dBc/Hz at 1 kHz away from a carrier of 1 mW at about 2 GHz. This compares with about −174 dBm/Hz (i.e. referred to a 1 mW carrier) for basic thermal noise. The gap of up to 90 dB is a large one, which it is an object of the present invention to reduce.

In addition to the low discriminator sensitivity (high loss), the arrangement of FIG. 1 is unsuitable for efficient additive phase-noise reduction of an FM oscillator for three main reasons, viz:

(1) The presence of a large FM wanted signal in the $J_1$ component would soon saturate the amplifier 4, which must be designed to handle low-level, i.e. noise, signals.
(2) Where the requirement is a wideband (i.e. large modulation-index) FM oscillator, the VCO will be inherently more unstable and prone to additive phase-noise than the kind of VCO designed only for small corrective frequency modulation.
(3) As will be seen, the detected noise from the discriminator is not suitable for frequency-modulating a VCO without further processing.

Figure 2:
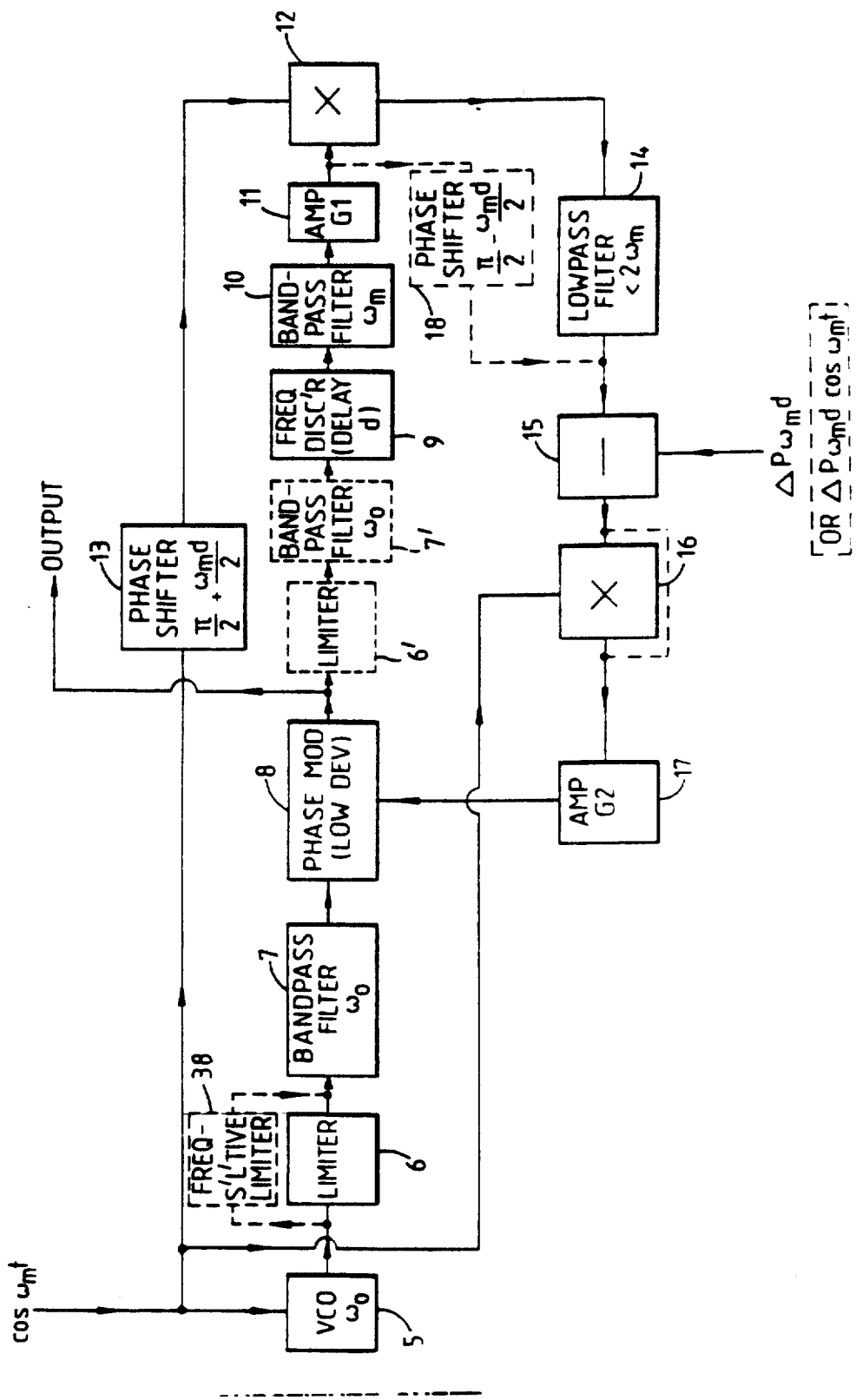
FIG. 2 is a similar diagram of an oscillator embodying one form of the present invention.

The present invention takes advantage of the differences between a frequency-modulated oscillator and a single-frequency (CW) oscillator, and one form is shown in FIG. 2.

In FIG. 2 a VCO 5 of frequency $\omega_o$ is frequency-modulated by a signal $\cos \omega_m t$ to produce the phase-modulated signal expressed by equation (3). The output of VCO 5 is amplitude-limited by a clipping limiter 6 followed (neglecting meanwhile circuit 38) by a bandpass filter 7 centred on $\omega_o$ of the VCO. Clipping limiter 6 itself generates a further noise component having multiplicative-like properties but which arises from additive noise. This further component is additional to that arising from true multiplicative sources, and also additional to the additive-derived multiplicative-like component arising from amplitude-limiting within VCO 5 mentioned in the second and fourth paragraphs of the present Application. If the above further component generated by limiter 6 is not acceptable, it can be eliminated or greatly reduced by a modification which will be described later. The filter 7 output is fed via a low-deviation (e.g. approximately ±45°, or 0.8 radian, maximum) phase-modulator 8 to a frequency discriminator 9 incorporating a delay d (neglecting meanwhile circuits 6′ and 7′), whose output is fed via a bandpass filter 10 centred on $\omega_m$ and an amplifier 11 of gain G1 to a multiplier 12. A suitable circuit for component 8 will be described later. In multiplier 12 the signal is combined with a version of $\cos \omega_m t$ phase-shifted by a phase-shifter 13 through $$\left(\frac{\pi}{2} + \frac{\omega_m d}{2}\right),$$

and its output fed via a low-pass filter 14 which stops the $2\omega_m$ component, and a subtraction circuit 15, to a second multiplier 16 which also receives cos $\omega_m t$. Circuit 15 receives a DC input $\Delta P\omega_m d$ which is subtracted from the signal received from filter 14. The multiplier output is fed via an amplifier 17 of gain G2 to phase-modulate the output of filter 7 in modulator 8. The desired noise-reduced output is taken from modulator 8.

The operation of FIG. 2 is as follows. The output of VCO 5 is a waveform represented by equation (3) earlier. The noise term $\delta P_m$ produces noise sidebands about the $\omega_m$ modulation and hence the noise frequencies are taken with respect to the $\omega_m$ frequency; i.e. a noise component at frequency $\omega_o \pm \omega_m$ is represented as information-band noise at zero frequency, or $\omega_n$=(actual noise frequency minus $\omega_m$). $\delta P_m$ can thus be replaced by the general expression $\delta P_m$ cos $\omega_n t$ in this restricted information band about $\omega_m$. The information bandwidth may be, for example, in the range from 50 Hz or less, up to 10 kHz.

The output from discriminator 9 is found by inspecting the $J_1$ component of equation (6) where, ignoring the effect of the small time-delay d on $\delta P_m$, one can write:

$$\text{Output} = 2J_1 (\Delta P + \delta P_m \cos \omega_n t \, \omega_m d) \sin\left(\omega_m t + \frac{\omega_m d}{2}\right) \quad (8)$$

$$\approx (\Delta P + \delta P_m \cos \omega_n t) \, \omega_m d \sin\left(\omega_m t + \frac{\omega_m d}{2}\right)$$

+ other Bessel terms containing $2\omega$ etc

This last expression is seen to contain the modulation term $\omega_m$ plus noise compounds $\omega_n$. Filter 10 has a bandwidth sufficient to pass any likely small variations of $\omega_m$ but rejecting any signals at $2\omega_m$ which could beat with $\omega_m$ in multiplier 12. Multiplier 12 eliminates the $\omega_m$ term by multiplication with the term $$\sin\left(\omega_m t + \frac{\omega_m d}{2}\right)$$

obtained from phase-shifter 13. The net output of multiplier 12 is thus:

$$\frac{1}{2} \times [\Delta P + \delta P_m \cos \omega_n t] \, \omega_m d \left[1 - \cos 2\left(\omega_m t + \frac{\omega_m d}{2}\right)\right] \quad (9)$$

which, after filter 14 has removed the $2\omega_m$ term, gives $$\text{Output} = \frac{\omega_m d}{2} [\Delta P + \delta P_m \cos \omega_n t]$$

The fixed DC term $\delta P_m \omega_m d$ is removed in circuit 15 by subtracting an equal and opposite value, leaving $$\text{Output} = \omega_m d \, \delta P_m \cos \omega_n t \quad (10)$$

Comparing equation (10) with equation (7) for a CW oscillator, it is seen that the sensitivity has been improved by the ratio $\omega_m/\omega_n$, since in equation (7) $\omega_n$ is effectively near zero (see para (b) earlier), whereas in equation (10) the corresponding term is $\omega_m$. For $\omega_m/\omega_n$ ratios of 100 to 1000, this reduces the discriminator loss of 40 to 20 dB compared with FIG. 1.

It is also seen that the time-variant term cos $\omega_n t$ in equation (10) is in phase with the original phase-noise phase modulation of $\delta P$ (i.e. with $\delta P_m$ cos $\omega_n t$) in equation (3), as distinct from the quadrature relationship existing when $\Delta P$ and $\omega_m$ are zero as in FIG. 1 with its two corresponding equations, viz post-discriminator equation (7) (corresponding to equation (10)) and phase-modulation equation (2) (corresponding to equation (3)). Hence, after reconversion to a cos $\omega_m t$ base in multiplier 16 and subsequent amplification, the output (10) is fed back to the phase modulator 8 (rather than to the frequency-modulated VCO 5 in the manner of FIG. 1) as $$\text{Output} = \omega_m d \delta P_m \cos \omega_n t \cos \omega_m t \quad (11)$$

or, in terms of the notation used in equation (3)

$$\text{Output} = \omega_m d \, \delta P_m \cos \omega_m t \quad (12)$$

The VCO 5 is therefore outside the feedback loop, which is an advantage because it improves the short-term stability. This is because feedback to the VCO would involve feedback to circuit elements therein designed to impose large-scale modulation. The FIG. 2 circuit does not correct long-term stability, but this is not always of importance. If it is, an additional DC $J_0$ output (see equation (6)) can be taken from distributor 9 and fed back to the VCO in the conventional manner of FIG. 1.

For convenience of explanation, amplifiers 11 and 17 are shown as separate units, the form acting to overcome the losses (i.e. attenuation by the factor $\omega_m d$) in the discriminator and the latter to give the required feedback performance. It will be apparent to those skilled in the art, however, that these two amplifiers can be combined in a single amplifier of gain G1×G2, substituted for amplifier 17. The filter 10 is not strictly essential if $2\omega_m$ terms are eliminated by selection of the odd-order Bessel terms, but can help to prevent stray spurious and $2\omega_m$ etc. signals outside the information band reaching amplifier 11. It can also serve to define the information bandwidth, though this is more suitably done by filter 14.

In the foregoing description the constant DC term in equation (9), $\delta P_m \omega_m d$, is removed by DC cancellation in subtraction circuit 15. This simple method may not always be sufficiently accurate if $\Delta P$ is very large compared with $\Delta P_n$, because of dynamic-range limitation in amplifier 17 (either alone or including amplifier 11 as described). This amplifier must cope with very low levels of $\Delta P_n$ which are comparable to thermal noise limits, and hence the residual DC component must be kept very small, which is difficult to maintain over a long period because of drift. If required, the DC cancellation can be improved by substituting a high-pass filter with a cut-off near DC. This alternative will tend to reduce the feedback of the phase-noise correction output (11) near the frequencies very close to $\omega_m$, but this will be tolerable if the information band does not extend this low. It is in this low region that the long-term stability requirement, if any, resides, which can be met by an additional FIG. 1-type of feedback loop, as described.

In FIG. 2 as described, the output represented by equation (10) is obtained by beating the discriminator 9 output with a derived cos $\omega_m t$ term in multiplier 12. The final required correction output of equation (11) is obtained by again beating with cos $\omega_m t$ in multiplier 16. The same nett result can, in principle, be obtained omitting these two beating steps which return the signal to its original frequency $\omega_m$. In this modification, as shown by interrupted lines, components 12, 14 and 16 are omitted, and the output of amplifier 11 (or of discriminator 9 or filter 10 if amplifiers 11 and 17 are combined) is fed direct to subtraction circuit 15 via a phase-shifter 18 which introduces a phase-shift of $$\phi = \left(\frac{\pi}{2} - \frac{\omega_m d}{2}\right).$$

Equation (9) can then be rewritten as $$\omega_m d \left[ \Delta P + \delta P_n \cos\left(\omega_n t + \frac{\phi \omega_n}{\omega_m}\right) \right] \cos \omega_m t \quad (13)$$

Except for the $\Delta P \cos \omega_m t$ and $\phi \omega_n / \omega_m$ factors, equation (13) is identical to equation (11) which represents the required correction output. The first of these factors can be removed by subtracting a constant AC term of $\Delta P \cos \omega_m t$ in circuit 15. The second factor is small for large $\omega_m / \omega_n$ ratios even if $\phi$ tends to 90°. On balance, however, the two-multiplier circuit is preferred because AC cancellation is more complex than DC and the error introduced by $\phi \omega_n / \omega_m$ might be of concern in some instances.

The phase-noise reduction about the $\omega_m$ sidebands applies only to additive noise, since multiplicative noise produces correlated noise about each $\omega_m$ sideband which can be shown to be undetected by circuit 9 of FIG. 2, unlike the detected additive noise sidebands close to $\omega_m$. Thus the VCO 5 should be designed to minimise multiplicative noise.

The arrangement of FIG. 2 provides reasonably good discriminator sensitivity, via equation (10), and may be sufficient for some purposes. For example, with an oscillator having a $-85$ dBc/Hz additive phase-noise level within the information band around $\omega_m$, then with a loop gain compounded of a G1 of 40 dB (to overcome discriminator loss) and a G2 of 50 dB, together with a power input level to the discriminator of $+20$ dBm, a phase-noise level of about $-152$ dBm/Hz with respect to 0 dBm (i.e. 1 mW) is obtainable. This reduced level is about 20 dB higher than the theoretical minimum obtainable, and can only be further reduced by higher loop gain. However, in practice the above total loop gain of 90 dB is already high, and without careful design might produce loop instabilities. This high gain can be reduced if a longer discriminator delay d is used, but this itself could cause further loop instabilities. An arrangement which improves the performance in this respect is shown in FIG. 3.

As already shown, the output from discriminator 9 in FIG. 2, i.e. equation (8), contains the noise component, $\Delta P_n \cos \omega_n t$, in the correct phase to allow correction by direct phase-modulation. In FIG. 2 feedback correction is used. FIG. 3 shows a feedforward correction arrangement. FIG. 3 is similar to FIG. 2 except that the VCO output from filter 7 is fed to a power hybrid 24, whose output divides between discriminator 9 and, via a d/2 delay circuit 25, a small-deviation phase-modulator 20 which is fed with the modulating signal from mixer 16 via an amplifier 19 of gain G3. G3 itself is approximately unity (in practice a little higher to compensate for losses) since it is in a feedforward rather than a feedback loop, but amplifier 19 may incorporate amplifier 11 as before in which case it will have a gain of approximately G1. The VCO output is thus corrected directly as shown. It can be shown mathematically that the introduction of the d/2 delay circuit 25 counteracts the effects of the phase shift produced by the discriminator delay d and hence allows d to be increased. This can reduce the discriminator loss to about 20 dB. The d/2 delay can be taken from halfway along the delay d portion of circuit 9 (see FIG. 7) to reduce expense.

As in FIG. 2, circuits 12, 14 and 16 can be omitted and replaced by the phase-shifter 18, with AC subtraction in circuit 15. This is also true of FIGS. 4 and 5, to be described.

Figure 3:
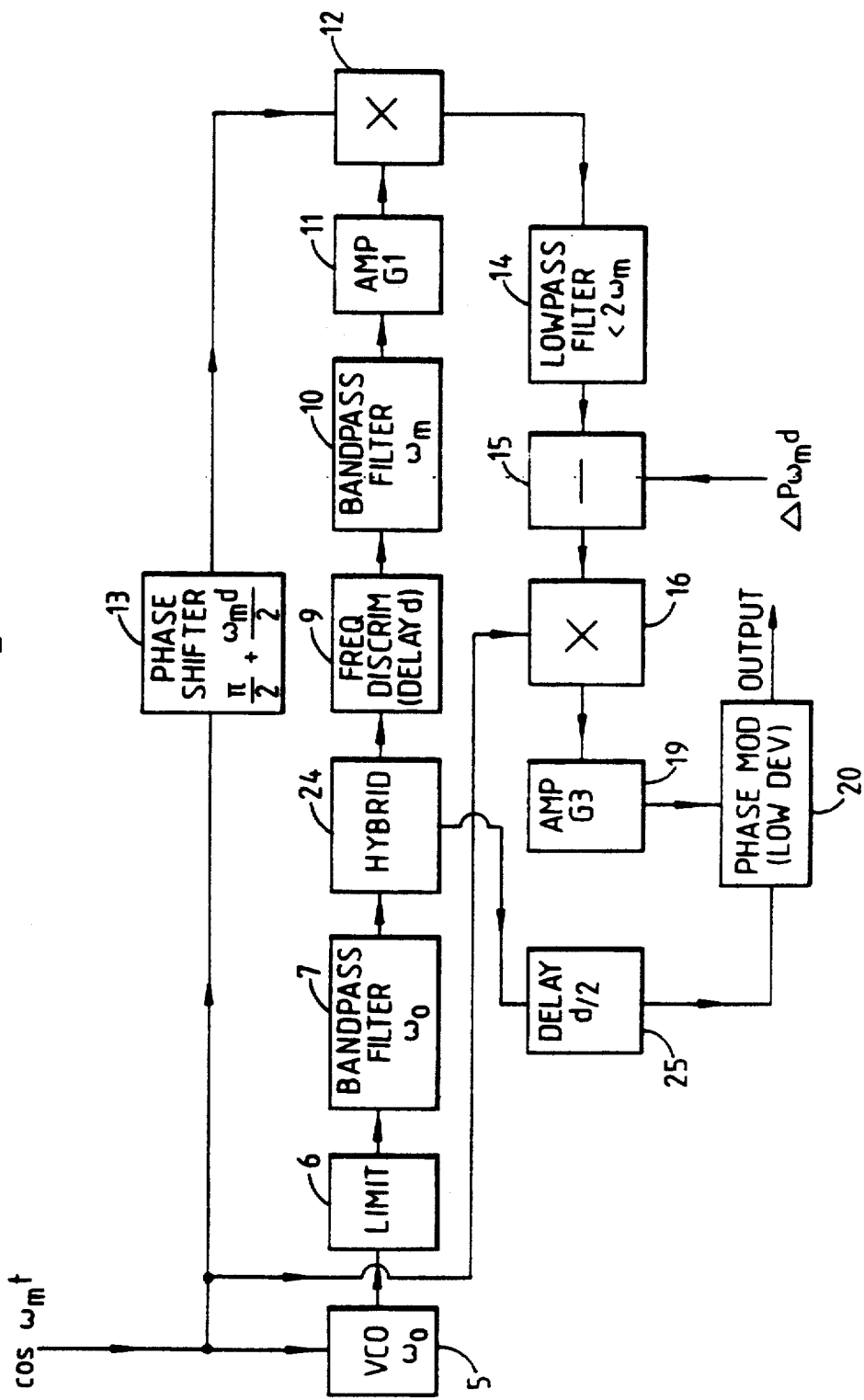
FIG. 3 is a similar diagram of an oscillator embodying another form of the present invention.

In FIG. 3 the original additive phase-noise modulation on the VCO output can, in theory, be reduced to zero by perfect cancellation, leaving only the G1 amplifier noise, by manual adjustment of G3. In practice, however, a greater than 20-40 dB improvement over the original phase-noise level is likely to be obtainable over a short period only, owing to drift in the gain setting. If the cancellation ratio is 20 dB, then the overall improvement will only be $-85 - 20 = -105$ dBm/Hz with respect to a VCO output of 1 mW (0 dBm), although with an oscillator of lower basic noise-level than $-85$ dBm/Hz the technique may be satisfactory. A sequence of such feedforward arrangements can be used to obtain further performance improvements down to the ultimate limit set by multiplicative noise. In such a sequence the output of phase-modulator 20 is treated as the output of VCO 5 and fed to a second limiter 6, filter 7, etc., using a common phase-shifter 13. However, such a sequence is costly as regard components, particularly the discriminator 9 and delay 25 circuits.

Figure 4:
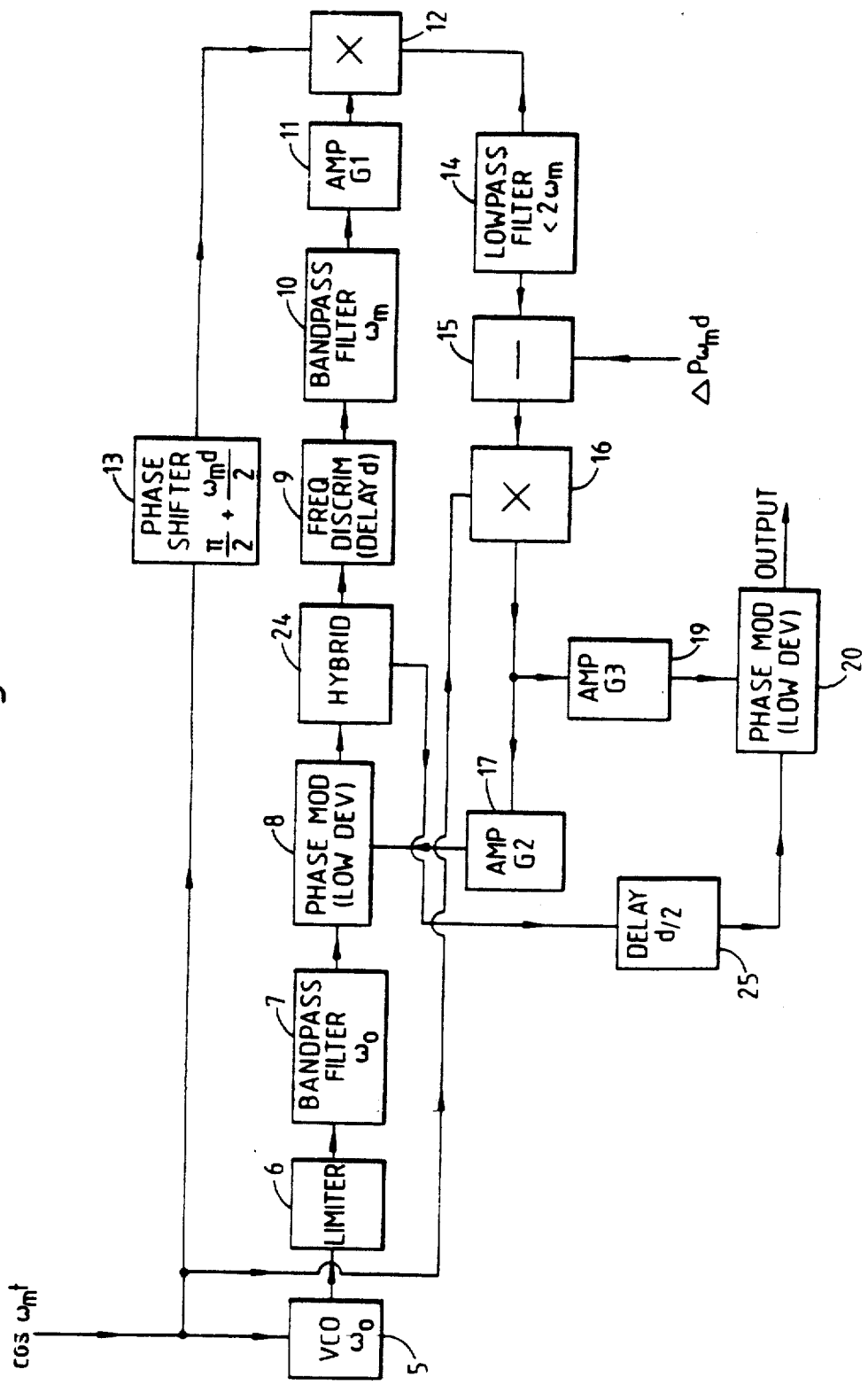
FIG. 4 is a similar diagram combining the forms of FIGS. 2 and 3.

The systems of FIGS. 2 and 3 can be advantageously combined as shown in FIG. 4. The feedback loop comprises amplifier 17 and modulator 8 and is followed by one or more FIG. 3 feedforward stages, to provide further 20-40 dB improvement steps. For example, a FIG. 2 arrangement having the aforesaid characteristics can, in the absence of multiplicative noise, provide a performance down to $-152$ dBm/Hz, with the FIG. 3 arrangement reducing this by a further 20 dB. If the gain required for this FIG. 2 arrangement is considered undesirably high, it can be reduced by accepting a lower feedback performance and compensating for this by an additional FIG. 3 feedforward stage.

Figure 5:
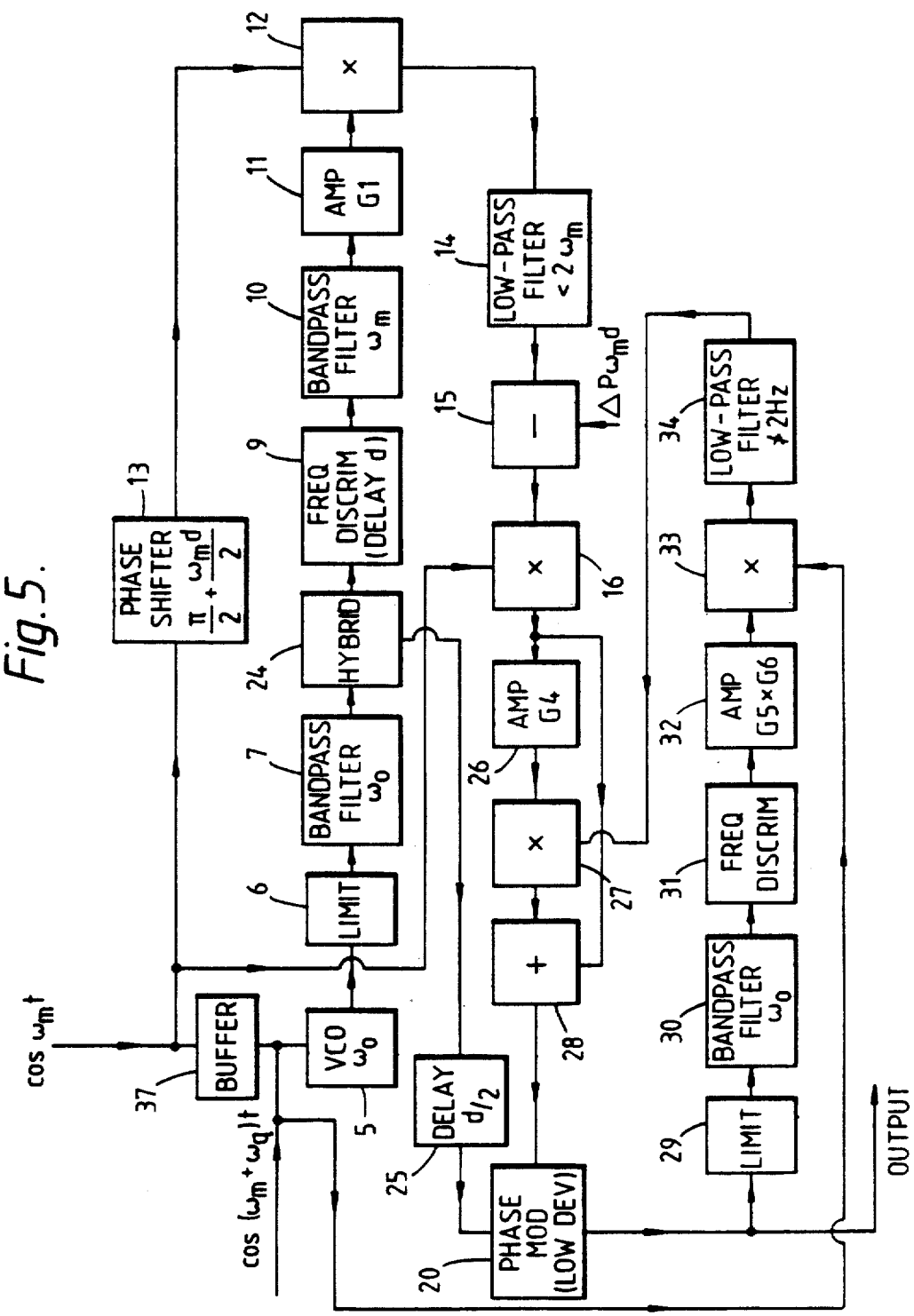
FIG. 5 is a similar diagram of an oscillator embodying a yet further form of the invention.

Such multiple arrangements are technically satisfactory, but are expensive in low-loss discriminator circuits etc. A preferable alternative is to use a feedback path within a feedforward arrangement so as to obtain automatically the long-term high cancellation desired. This is achieved by the arrangement of FIG. 5. The circuit of FIG. 5 is similar to that of FIG. 3 except that a modulating pilot-tone cos $(\omega_m + \omega_q)t$ is applied to VCO 5 in addition to the signal modulation cos $\omega_m t$, separated by a buffer circuit 37. $(\omega_m + \omega_q)$ can be near $\omega_m$, but is preferably outside the band over which the noise is to be reduced, e.g. a relevant information bandwidth; thus for $\omega_m = 200$ kHz, $\omega_q$ may be 50 kHz, making $(\omega_m + \omega_q) = 250$ kHz. The modulation index $\Delta P_q$ of the pilot-tone is suitably about 0.1 radian, i.e. small relative to the modulation index $\Delta P$ of the signal cos $\omega_m t$ (e.g. 20 radians) but greater than the noise modulation index $\Delta P_n$. $\omega_q$ can be a negative instead of a positive increment.

In FIG. 5, instead of being connected to modulator 20 via amplifier 19 alone as in FIG. 3, multiplier 16 is connected thereto via amplifier 26 of gain G4, multiplier 27 and adder 28. The output of modulator 20 is connected via a feedback loop to multiplier 27, this loop comprising an amplitude limiter 29 and bandpass filter 30 (similar to circuits 6 and 7), a frequency discriminator 31, an amplifier 32 of gain $G5 \times G6$, a multiplier 33 and a low-pass filter 34 which stops frequencies greater than suitably about 2 Hz. Multiplier 33 is also fed by the pilot-tone cos $(\omega_m + \omega_q)t$ and, with filter 34, acts as a correlator.

In operation, the basic feedforward arrangement of FIG. 3 is now controlled, to obtain improved long-term noise cancellation, by the circuits 26, 27 and 28, the control input of multiplier 27 being obtained from the aforesaid feedback loop. The latter loop detects the residual pilot-tone-modulated content of the output of modulator 20 (which is also the final output of the oscillator) in the form of an output from filter 34 whose amplitude and polarity vary with variations in the amplitude and phase of the above pilot-tone content.

The output of filter 34 is multiplied in circuit 27 with the output of the original feedforward loop enhanced by the gain G4 of amplifier 26, to produce an output from multiplier 27 which varies similarly with the above content. Thus the feedback loop produces from multiplier 27 an output which, when fed to modulator 20 via adder 28 (where it is summed with the output of the feedforward loop), counteracts the 20 dB cancellation error of the feedforward loop and so reduces the pilot-tone content of the final output to a defined level. In effect, circuits 26, 27 and 28 constitute an automatic gain-control replacing the manual gain-control 19 in FIG. 3, adjusting the near-unit gain as required to produce the defined cancellation. This reduction in pilot-tone content reduces the phase-noise content in the same proportion.

The amplifier 26 can alternatively be connected between circuits 34 and 27 but its illustrated location is preferred, as will be apparent to those skilled in the art, because it distributes the gain between circuits of different frequencies and avoids a large loop gain in the feedback loop, both desirable for stability. It will also be apparent that the gains G6 and G4 are interchangeable.

In FIG. 5 the filters 10 and 14 must additionally pass $(\omega_m = \omega_q)$ and $\omega_q$ respectively. This can be effected either by the appropriate selection of their pass bands, or, where necessary, by connecting appropriate bandpass filters (not shown) in parallel with those of FIG. 3.

With a $\Delta P_q$ of 0.1 radian and an initial feedforward loop cancellation of only 20 dB, a final cancellation of $\Delta P_q$, and hence of phase noise, of about 90 dB is obtainable with the arrangement of FIG. 5, given a loop gain of 90 dB for $G6 \times G4$. The function of G5 is to overcome the losses in discriminator 31. The high gains required are not as potentially destabilising as in the FIG. 2 arrangement, because the feedback gain is only $G5 \times G6$ and not $G4 \times G6 \times G1 \times G5$; furthermore the frequencies in the feedback loop (incorporating $G5 \times G6$) are very low and limited by the correlator bandwidth of about 2 Hz. The frequency discriminator 31 in this loop can be fairly simple, say with a loss of 50 dB, i.e. having a delay less than the delay d of discriminator 9, to take advantage of the relative stability of this feedback loop.

The purpose of introducing the pilot-tone is solely to set the control of the cancellation, as defined by the multiplier 27. The signal deviation, $\Delta P$, and the noise deviation $\delta P_m$, are respectively too large and too small to be used for this function. The pilot-tone frequency can be within the information bandwidth (instead of outside it, as in the above description) if the residual pilot-tone can be tolerated in the oscillator output in a particular application. Otherwise a subsequent phase-modulation stage could be used to reduce it to an acceptable level. However this stage could itself be liable to drift etc. problems, and such an arrangement is not preferred.

The low-deviation phase-modulators 8 and 20 can be commercially available types is suitable for the operating frequency band of the oscillator and relatively free of multiplicative noise. More generally, they can be of the kind shown in FIG. 6 in which for the purpose of explanation, a notionally noise-free modulated VCO output is assumed fed into a 90° (quadrature) hybrid 21; a first output of the latter is connected directly to one input of a 180° hybrid (adder or subtractor) 22 and a second output, in quadrature with the first, is connected to the second input of the 180° hybrid 22 via a multiplier 23 of a form selected as having sufficient dynamic range to be suitable for use as a balanced modulator and which also receives a modulating signal. The theory of operation is as follows:

The two outputs from hybrid 21 are of the form $$\cos(\omega_o t + P) \tag{14}$$

and $$\sin(\omega_o t + P) \tag{15}$$

where P represents a general modulation term.

The output (15) after multiplication in multiplier 23 by a general modulating term M, where $M << 1$, becomes $$M \times \sin(\omega_o t + P) \tag{16}$$

The final output of the modulator is then given by $$\begin{aligned}(14) + (16) &= \cos(\omega_o t + P) + M \times \sin(\omega_o t + P) \\ &= \cos(\omega_o t + P + \tan^{-1} M) \\ &\approx \cos(\omega_o t + M)\end{aligned} \tag{17}$$

for M (in radians) $<< 1$.

Equation (17) can also be written in a form applicable to the correction of the noise-corrupted VCO waveform of equation (1) by making $$P = \Delta P \cos \omega_m t + \delta P \cos \omega_m t$$

as in equation (1) and $M = G\omega_m d \, \delta P \cos \omega_m t$, i.e. $G \times$ equation (12)

The corrected VCO output then becomes $$\cos(\omega_o t + \Delta P \cos \omega_m t + \delta P \cos \omega_m t - \tag{18}$$

-continued $$G\omega_m d\, \delta P \cos \omega_m t) = \cos(\omega_o t + \Delta P \cos \omega_m t)$$

taking the feedforward case where $G = G1 \times G3$, $G\omega_m d \simeq 1$ and the feedforward signal is given the appropriate phase.

Those skilled in the art will recognize that feedback correction is obtainable in a corresponding manner.

The conditions that $\tan^{-1} M = M$ (in radians) for $M << 1$ holds for M up to about 30° after which the relationship becomes progressively less linear. In the present case the noise is normally so small that $M < 10°$, e.g. about 2°, where the equality is close.

Figure 6:
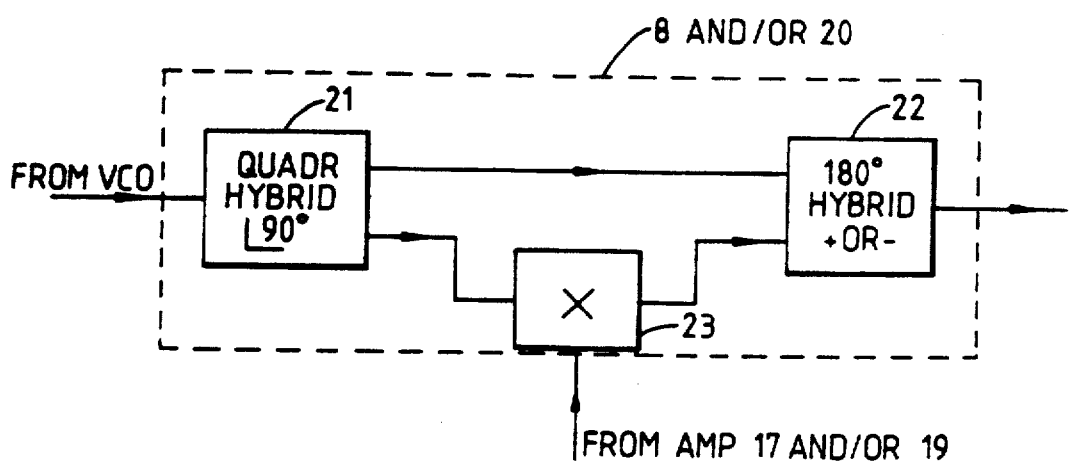
FIG. 6 is a similar diagram of a phase modulator for use in the circuits of FIGS. 2 to 5.

The multiplier 23 in FIG. 6 can be a source of multiplicative noise. If so, its effect can be reduced by using higher-level inputs thereto, e.g. via amplifiers, and attenuating the resultant output before application to hybrid 22.

Equation (18) is included to aid understanding of the correction process and its relationship to the small-deviation phase-modulator. It is not exact since it neglects internal noise and assumes perfect cancellation. In practice, lower limits than $-174$ dBm/Hz are not achievable; moreover residual multiplicative noise is usually higher and thus sets the obtainable limit. As stated earlier, this multiplicative noise is correlated about each $\omega_m$ sideband and is not detected in the time-delay discriminator 9 at the frequency $\omega_m$. Hence it cannot be corrected by the feedback/forward arrangements described in the present Application. The foregoing theory demonstrates that a small modulation-index phase-modulation, M, i.e. the noise-correcting signal, can be added to the VCO signal even when the latter is already phase-modulated by P, which contains the relatively large modulation-index term $\Delta P$, i.e. that the phase-modulating correction technique used in FIGS. 2 to 5 is operable.

The description so far has been concerned with phase-noise reduction about a defined information band centred on the frequency/phase modulation applied to the VCO. As explained, this required that the applied modulating frequency ($\omega_m$) must be much greater than the information/noise frequencies $\omega_n$ (referred to the modulating frequencies) in that band, and that the modulation index $\Delta P$ of the applied modulating frequency must be much greater than the modulating index $\Delta P_n$ of the information/noise modulation. Although this allows objective (ii) above to be achieved, this is usually less important than achieving objective (i).

Figure 8:
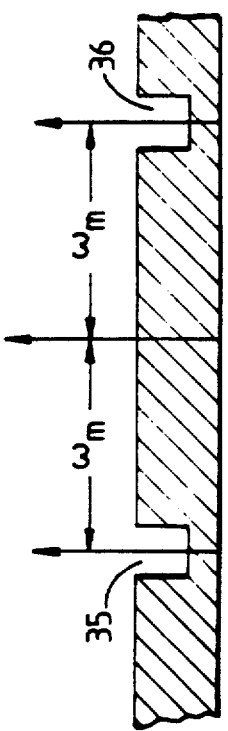
FIG. 8 is a diagram showing low-noise information bands obtainable by the circuits of FIGS. 2 to 5.

As stated, objective (i) is a CW oscillator having low additive noise in a band around its fixed output frequency, i.e. as in equation (2A). It is assumed that the multiplicative noise is at an acceptable level which in practice usually sets the ultimate phase-noise performance of the oscillator, and there is therefore normally little purpose in seeking to reduce the additive phase-noise level below that of the multiplicative phase-noise. Objective (i) can thus be realized by deliberately introducing a frequency/phase modulation of small modulation index, e.g. less than 1.0 radian, though still greater than that of the phase-noise, in accordance with the above criteria. However, the additive noise reduction will only occur in defined information bands based about the modulating frequency. This limitation is shown in FIG. 8, which shows a small-deviation frequency/phase modulation $\omega_m$ producing appropriate sidebands about the carrier $\omega_o$, i.e. the nominal centre frequency of the oscillator. Also shown are the main upper and lower information bands 35 and 36 which have a reduced phase-noise content (shown by cross-hatching) after processing by the means shown in FIGS. 2 to 7.

In some CW applications the presence of the small-deviation index frequency/phase modulation $\omega_o/\omega_m$ thus introduced to obtain the low-noise information bands 35 and 26 can be tolerated. However, if required, this modulation can be removed by feeding the signal through another phase modulator (not shown) to which is applied a modulating signal which is antiphase with the modulation introduced to obtain the low-noise bands, i.e. the phase-modulated signal after the latter additional correction $$= \cos(\omega_o t + \Delta P \cos \omega_m t - \Delta P \cos \omega_m t)$$
$$= \cos \omega_o t$$

where $\omega_o$ now represents the carrier $\omega_o$ plus its phase-noise but retaining the two low-noise bands 35 and 36. This waveform is useful as a CW oscillator waveform for mixing with information-containing signals within these low-noise bands. It is less useful if the low-noise information band is required to be close to the carrier, e.g. for use in zero-IF/direct-conversion receivers.

This last requirement can be met, however, by retaining the full sideband structure of FIG. 8 and then extracting one of the low-noise sidebands, e.g. by means of a bandpass filter (not shown), but rejecting the carrier and the other main sideband plus any further sidebands resulting from the modulation-index value used. The extracted sideband can be amplified and used as the oscillator signal. There is a minor problem with this technique in that the original carrier will have an amplitude greater than that of the sidebands by the ratio $J_0(\Delta P)/J_1(\Delta P)$ where $\Delta P$ is small and $J_0$ and $J_1$ are zero- and first-order Bessel Functions respectively. (This ratio is obtained via the usual expansion of the expression for a phase-modulated waveform.) A value of $\Delta P$, for example, of about 0.5 radian would given an amplitude ratio of 4.75, which necessitates a high rejection of the unwanted carrier $\omega_o$. This in turn requires $\omega_m$ to be relatively large so that adequate filtering between $\omega_0$ and $\omega_o + \omega_m$ (or $\omega_o - \omega_m$) can be obtained. However, if $\omega_m$ is too large its generation can produce its own phase-noise problems.

The latter difficulty can be overcome by generating $\omega_m$ itself by the technique of FIGS. 2 to 5, i.e. by phase modulating $\omega_m$ with a signal $\omega_m/R$ where $R >> 1$. The phase-noise problem in $\omega_m$ is thus transferred to this lower frequency $\omega_m/R$ just as in FIGS. 2 to 5 it is transferred from $\omega$ to $\omega_m$. $\omega_m/R$ must still be greater than the required information bandwidth.

Thus the technique described with reference to FIG. 8 provide a way of obtaining an additive phase-noise performance from a high-frequency oscillator which would normally be expected only from an oscillator of much lower frequency, viz by a sequence of one or more phase-modulating steps depending on the amount of filtering which it is desired to use, i.e. a series of FIG. 2 to FIG. 5 circuits with the output of each connected to frequency/phase-modulate the VCO of the next succeeding circuit.

It will also be seen that the techniques described with reference to FIG. 8 can also be used to stabilise $\omega_m$ in the FIG. 2 to FIG. 5 arrangements where a full low-noise sideband structure is required, if $\omega_m$ is large and would therefore tend to generate its own high level of phase-noise.

In using the circuit of FIG. 5 to obtain a CW output as described with reference to FIG. 8, it might appear that one could make $\omega_m$ itself the pilot-tone. Although possible in principle, this would be awkward in practice because it would involve simultaneously trying to reduce the $\omega_m$ content in the output while requiring to retain it.

An mentioned earlier in the description of FIG. 2, the clipping limiter 6 in FIGS. 2 to 5 produces by its action a further correlated noise component, arising as follows. Additive-noise sidebands generated within VCO 5 close-in to its instantaneous frequency, i.e. within a bandwidth about this frequency which is much less than the modulating frequency $\omega_m$, have both amplitude-modulation and phase-modulation components. Ideally the amplitude-modulation component should not be amplitude-limited by limiter 6, as such limiting produces the above further correlated noise component about each $\omega_m$-based sideband of the frequency-modulated VCO 5. As stated earlier, this correlated noise is equivalent to multiplicative noise, and is additional to multiplicative noise generated by any limiting processes within the oscillator itself as well as that generated by multiplicative processes within the oscillator itself. Correlated noise of all these forms is not reduced by the present invention, and hence if it is required to minimize the overall level of such noise, its generation by the limiter 6 must be eliminated or reduced. This can be achieved as follows.

As stated above, ideally the limiter 6 should not limit the amplitude of the above close-in sidebands, thereby preventing the presence of corresponding correlated sidebands in the final outputs of the circuits of FIGS. 2 to 5. Sidebands other than these close-in sidebands must be amplitude-limited, however, in order for the present invention to operate. Also, amplitude-limiting of the close-in sidebands is still essential for the frequency-discriminator 9 to function properly. These requirements can be met by moving the clipping limiter 6 followed by bandpass filter 7 to immediately precede the discriminator 9 (as shown at 6' and 7' in FIG. 2 by interrupted lines). The former clipping limiter 6 is replaced by a frequency-selective limiter 38 (shown similarly) arranged to amplitude-limit only those noise sidebands other than the above close-in sidebands.

A suitable frequency-selective limiter 38 is formed, for example, by a normalizer circuit as described in our copending GB Application No. 8712556 (published as GB Application No. 2,191,321A), modified to be frequency-selective. This normalizer, e.g. as shown in FIG. 1 thereof, comprises a linear detector which receives the input signal (here from VCO 5) and whose output is fed as denominator to a divider circuit. The divider receives as numerator a reference voltage (for present purposes a fixed voltage set at a suitable level), and the divider output is fed to a multiplier which also receives the input signal. The mixer output is the normalized (here limited) input signal. The frequency-selective modification comprises connecting a filter circuit between the detector and divider to stop the above close-in frequencies being passed to the divider. This filter circuit is arranged to stop frequencies from near DC to, suitably, about one-fourth $\omega_m$, and to pass higher frequencies. (Our copending GB Application No. 8728577 includes a fuller description of frequency-selective normalizer circuits based on that of Application No. 8712556.) In this way the normalizer output is amplitude-modulated only by the above close-in frequencies. Since the normalizer does not distort its output as does a clipping limiter, the bandpass filter 7 which followed limiter 6 may not be needed in the normalizer output to remove such distortion, though possibly found desirable for other reasons.

The above modifications to FIG. 2 can be made similarly in FIGS. 3 to 5.

I claim:

1. A method of reducing the additive phase-noise in the output from an oscillator of given frequency, in at least one defined frequency band, comprising:

applying a frequency-modulating signal to the oscillator to produce a frequency-modulation sideband of said given frequency within said band, said signal having a frequency much higher than the highest multiplicative phase-noise frequency in that band and producing a modulation index much greater than the modulation index of the total phase-noise in that band, total phase noise comprising additive phase-noise plus multiplicative phase noise;

and phase-modulating the output from said oscillator with a signal at the modulating frequency selected by a filter means from the output of a frequency-discriminator having an appropriate delay which receives an amplitude-limited version of the oscillator output either before or after said phase-modulating thereof, in a sense and at an amplitude which tends to cancel the additive phase-noise modulation in the oscillator output;

whereby the thus phase-modulated output from the oscillator is a frequency-modulated output having reduced additive phase-noise in said band.

2. A method as claimed in claim 1 wherein said amplitude-limited version of the oscillator output is produced solely by amplitude-limiting the immediate output of the oscillator.

3. A method as claimed in claim 1 wherein said amplitude-limited version of the oscillator output is produced by amplitude-limiting the immediate output of the oscillator other than sidebands close-in to the instantaneous frequency of the oscillator and, in addition, amplitude-limiting the immediate input to said frequency-discriminator.

4. A method as claimed in claim 1 wherein the discriminator receives the oscillator output after said phase-modulating thereof and said selected signal is fed back to effect said phase-modulating after relatively high amplification thereof.

5. A method as claimed in claim 1 wherein the discriminator receives the oscillator output before said phase-modulating thereof and said selected signal is fed forward to effect said phase-modulating after relatively low amplification thereof.

6. A method as claimed in claim 4 wherein the selected signal is multiplied by an appropriately phase-shifted version of the frequency-modulating signal, and the components of the product at the additive phase-noise frequencies only are selected and multiplied by the non-phase-shifted frequency-modulating signal, the product of said second-mentioned multiplication being applied to effect said phase-modulating.

7. A method as claimed in claim 4 wherein the selected signal is appropriately phase-shifted and only the resulting components modulated at the additive phase-noise frequencies are applied directly to effect said phase-modulating.

8. A method as claimed in claim 5, wherein a frequency-modulating pilot-signal is additionally applied to the oscillator to produce a modulation index greater than that of the total phase-noise but less than that of the first-mentioned frequency-modulating signal, and wherein the pilot-signal content of the additive phase-noise-reduced frequency-modulated oscillator output is detected and fed back to control the signal which effects said phase-modulating in a sense to reduce said pilot-signal content and hence the additive phase-noise content in said defined frequency band.

9. A method as claimed in claim 8 wherein the pilot-signal frequency is outside said defined frequency band.

10. A method as claimed in claim 1 wherein said additive phase-noise-reduced frequency-modulated output is subsequently phase-modulated with said first-mentioned frequency-modulating signal applied in anti-phase whereby to obtain an output consisting substantially of said given frequency with reduced additive noise in said band.

11. A method as claimed in claim 1 wherein said additive phase-noise-reduced frequency-modulated output is subsequently filtered to remove said given frequency and all but one of said frequency-modulation sidebands to leave substantially only said one frequency-modulation sideband with reduced additive phase-noise therein.

12. A method as claimed in claim 1 wherein the oscillator is a voltage-controlled oscillator.

13. Apparatus for reducing the additive phase-noise in the output from an oscillator of given frequency, in at least one defined frequency band, comprising:
an oscillator and means for applying a frequency-modulating signal to the oscillator to produce a frequency-modulation sideband of said given frequency within said band, said signal having a frequency much higher than the highest multiplicative phase-noise frequency in that band and producing a modulation index much greater than the modulation index of the total phase-noise in that band where total phase-noise is defined as additive phase-noise plus multiplicative phase-noise;
and a phase-modulator for phase-modulating the output from said oscillator with a signal at the modulating frequency selected by a filter means connected to the output of a frequency-discriminator having an appropriate delay and connected via an amplitude-limiting means to receive the oscillator output either before or after said phase-modulating thereof, in a sense and at an amplitude which tends to cancel the additive phase-noise modulation in the oscillator output;
whereby the thus phase-modulated output from the oscillator is a frequency-modulated output having reduced additive phase-noise in said band.

14. Apparatus as claimed in claim 13 wherein said amplitude-limiting means is connected to amplitude-limit only the immediate output of the oscillator.

15. Apparatus as claimed in claim 13 wherein said amplitude-limiting means comprises first amplitude-limiting means connected and arranged to amplitude-limit the immediate output of the oscillator other than sidebands close-in to the instantaneous frequency of the oscillator, and second amplitude-limiting means connected to amplitude-limit the immediate input to said frequency-discriminator.

16. Apparatus as claimed in claim 13 wherein the discriminator is connected to receive the oscillator output after said phase-modulating thereof and said selected signal is fed back to said phase-modulator to effect said phase-modulating via an amplifier of relatively high gain.

17. Apparatus as claimed in claim 13 wherein the discriminator is connected to receive the oscillator output before said phase-modulating thereof and said selected signal is fed forward to said phase-modulator to effect said phase-modulating via an amplifier of relatively low gain.

18. Apparatus as claimed in claim 16 wherein the selected signal is fed to a first multiplier which also receives, via a phase-shifter, an appropriately phase-shifted version of the frequency-modulating signal, and the components of the product at the additive phase-noise frequencies only are selected via filter means connected to the first multiplier and fed to a second multiplier which also received the non-phase-shifted frequency-modulating signal, the output of said second-multiplier being fed to said phase-modulator to effect said phase-modulating.

19. Apparatus as claimed in claim 16 wherein the selected signal from said filter means is fed via an appropriate phase-shifter to said amplifier whereby only the resulting components modulated at the additive phase-noise frequencies are applied directly to effect said phase-modulating.

20. A method as claimed in claim 17, comprising means for additionally applying a frequency-modulating pilot-signal to the oscillator to produce a modulation index greater than that of the total phase-noise but less than that of the first-mentioned frequency-modulating signal, means for detecting the pilot-signal content of the additive phase-noise-reduced frequency-modulated oscillator output and means for feeding it back to control the signal which effects said phase-modulating in a sense to reduce said pilot-signal content and hence the additive phase-noise content in said defined frequency band.

21. Apparatus as claimed in claim 20 wherein the pilot-signal frequency is outside said defined frequency band.

22. Apparatus as claimed in claim 13 wherein said additive phase-noise-reduced frequency-modulated output is fed to a further phase-modulator to which said first-mentioned frequency-modulating signal is fed in anti-phase as a phase-modulating signal whereby to obtain an output consisting substantially of said given frequency with reduced additive noise in said band.

23. Apparatus as claimed in claim 1 wherein said additive phase-noise-reduced frequency-modulated output is fed to filter means arranged to remove said given frequency and all but one of said frequency-modulation sidebands whereby the filtered output is substantially only said one frequency-modulation sideband with reduced additive phase-noise therein.

24. Apparatus as claimed in 13 wherein the means for applying the frequency-modulating signal to said oscillator comprises filter means arranged to remove said given frequency and all but one of said frequency-modulation sidebands whereby the filtered output is substantially only said one frequency-modulation sideband with reduced additive phase-noise therein, said frequency-modulating signal being constituted by said frequency-modulation sideband output.

25. Apparatus as claimed in claim 13 wherein the oscillator is a voltage-controlled oscillator.

* * * * *